United States Patent
Song et al.

(10) Patent No.: US 7,071,869 B2
(45) Date of Patent: Jul. 4, 2006

(54) RADAR SYSTEM USING QUADRATURE SIGNAL

(75) Inventors: In-sang Song, Seoul (KR); Song-cheol Hong, Daejeon (KR); Sang-soo Ko, Iksan-si (KR); Jeong-geun Kim, Gimpo-si (KR); Hong-chan Kim, Buan-eup (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/179,555

(22) Filed: Jul. 13, 2005

(65) Prior Publication Data

US 2006/0087473 A1    Apr. 27, 2006

(30) Foreign Application Priority Data

Jul. 13, 2004    (KR)    ............... 10-2004-0054442

(51) Int. Cl.
*G01S 7/35* (2006.01)
*G01S 7/02* (2006.01)
*G01S 13/00* (2006.01)

(52) U.S. Cl. .................. 342/194; 342/21; 342/70; 342/82; 342/175

(58) Field of Classification Search .......... 342/21, 342/70–72, 82–103, 118, 128–133, 175, 192–197, 342/200–205; 701/300, 301; 375/130–153; 324/76.52, 76.53; 327/113, 114, 116–123; 331/46, 56, 74–77, 96, 99–102, 107 R, 108 R, 331/114, 115, 107 DP, 107 P, 107 SL, 107 C, 331/132

See application file for complete search history.

(56) References Cited

U.S. PATENT DOCUMENTS 3,603,992 A * 9/1971 Goggins et al. ............ 342/193

(Continued)

FOREIGN PATENT DOCUMENTS

KR    1999-0069498 A    9/1999

(Continued)

OTHER PUBLICATIONS

M. Schott et al., "Low Phase Noise X-Band Clapp Push-Push Oscillator"; no date given; no publication given.*

*Primary Examiner*—Bernarr E. Gregory
(74) *Attorney, Agent, or Firm*—Sughrue Mion, PLLC

(57) ABSTRACT

A radar system using a quadrature signal includes a quadrature push—push oscillator for generating four harmonics with a 90-degree phase difference from each other, and producing two-balanced $2^{nd}$ harmonic signals from the harmonics; a first coupler block for radiating one of the $2^{nd}$ harmonics through an antenna; a second coupler block for terminating the other $2^{nd}$ harmonic to ground; and a power combiner for combining a transmitted signal that is leaked from the first and second coupler blocks with the received signal that is radiated through the antenna. The radar system features an improved receiving sensitivity by offsetting the leakage signals of the sending end. Also, the radar system can be made very small by using a single antenna for transmitting and receiving.

10 Claims, 5 Drawing Sheets

U.S. PATENT DOCUMENTS

| | | | | |
|---|---|---|---|---|
| 3,614,786 A | * | 10/1971 | Goggins, Jr. | 342/193 |
| 3,649,909 A | * | 3/1972 | Ort et al. | 324/76.53 |
| 3,719,946 A | * | 3/1973 | Sletten et al. | 342/193 |
| 4,217,585 A | * | 8/1980 | Fishbein et al. | 342/193 |
| 4,499,467 A | * | 2/1985 | Rittenbach | 342/194 |
| 4,967,160 A | * | 10/1990 | Quievy et al. | 327/116 |
| 5,059,927 A | * | 10/1991 | Cohen | 331/77 |
| 5,146,616 A | * | 9/1992 | Tang et al. | 342/201 |

FOREIGN PATENT DOCUMENTS

KR    2001-0005341 A    1/2001

* cited by examiner

RADAR SYSTEM USING QUADRATURE SIGNAL

CROSS-REFERENCE TO RELATED APPLICATIONS

This application claims benefit under 35 U.S.C. § 119 from Korean Patent Application No. 10-2004-0054442, filed on Jul. 13, 2004, the entire content of which is incorporated herein by reference.

BACKGROUND OF THE INVENTION

1. Field of the Invention

The present invention relates in general to a radar system using a quadrature signal. More specifically, an exemplary embodiment of the present invention relates to a low-price, high-sensitivity, high-performance subminiature radar system using a quadrature signal, wherein the radar system has many advantages in that a quadrature push—push oscillator composed of low frequency elements is employed to offset a leakage signal of a sending end and thus, increases receiving sensitivity; an increase in a noise figure of a receiving end caused by the leakage power can be prevented; the size of the radar system can be reduced markedly by sharing a transmitting and receiving antenna; a quadrature subharmonic mixer for the receiving end is used to suppress the occurrence of a DC-offset, which is resulted from even order distortion due to interference (or jamming) and self-mixing of a mixer due to signal leakage of a local oscillator; and the directional information on a target object, e.g., whether the target object is getting closer or getting away, can be obtained.

2. Description of the Related Art

In general, a vehicle collision warning radar system operates in 77 GHz (millimeter wave) band. However, making a signal source in such frequency band is very difficult and requires high-performance devices, which in turn increases costs of manufacture.

FIGS. 1A and 1B are circuit diagrams of a related art radar system. Particularly, FIG. 1A illustrates a radar system using a single antenna for transmitting and receiving, while FIG. 1B illustrates a radar system using two separate antennas for transmitting and receiving.

As aforementioned, the radar system in FIG. 1A uses a single antenna 104 so the size of the entire system can be reduced. However, the isolation between the sending signal and the receiving signal for the circulator 201 and the power divider 102 is extremely low in a millimeter frequency band. Thus, if a signal flows from a sending end with high power output into a receiving end, the receiving sensitivity of the radar system becomes so low that the radar system cannot detect a weak received signal.

In addition, if a high power signal flows into the receiving end, then a low noise amplifier 105 or a mixer 106 of the receiving end may become saturated, thereby deteriorating the entire system characteristics.

Also, because of the leakage signal of the sending end the noise figure of the receiving end gets worse.

The above mentioned problems are solved by developing a high-output radar system which uses two separate antennas as in FIG. 1B for transmitting and receiving.

In case of using two separate antennas, i.e., a transmitting antenna 104a and a receiving antenna 104b, the isolation between the sending end and the receiving end outperformed a case of the circulator 201. Thus, the receiving sensitivity of the system is improved and the saturation problem with the receiver is prevented. Nevertheless, these advantages do not necessarily outweigh the problem caused by using two antennas 104. That is, the area occupied by using two antennas 104 in the radar system is too large to embody a subminiature radar system.

In case of a CW (Continuous Wave) radar, a DC-offset occurs due to the even order distortion present in a direct conversion receiver and the leakage signal of a local oscillator. Moreover, in case of a Doppler radar, the Doppler shift is extremely low between tens of Hz to hundreds of kHz, so the radar is under heavy influence of flicker noise and therefore the receiving sensitivity of the radar is markedly deteriorated.

The quadrature mixer might be the optimal choice for obtaining directional information on a target object, i.e., whether a target object is getting closer or farther away, if an additional circuit for generating an additional phase difference in need of the quadrature signal generation for driving the mixer would not be required.

SUMMARY OF THE INVENTION

It is, therefore, an object of the present invention to provide a low-price, high-sensitivity subminiature radar system. It is another object to provide a quadrature push—push oscillator composed of low frequency elements to offset a leakage signal of a sending end and thus, increase receiving sensitivity. It is another object of the invention wherein the saturation on the receiver caused by the leakage signal of the sending end can be prevented. It is yet another object of the invention wherein the increase in the noise figure of the receiving end caused by the leakage power of the sending end is prevented. It is yet a further object of the invention in which the size of the radar system can be markedly reduced by sharing a transmitting and receiving antenna.

Another object of the present invention is to provide a low-price, high-performance radar system, in which a quadrature subharmonic mixer for the receiving end is used to suppress the occurrence of a DC-offset, that results from the even order distortion due to jamming and self-mixing of a mixer due to signal leakage of a local oscillator; and the directional information on a target object, e.g., whether the target object is getting closer or farther away, can be obtained.

Still another object of the present invention is to provide an adaptive radar system featuring a high isolation between the sending and receiving ends by monitoring output values of a mixer and correcting a mismatch of quadrature push—push signals through a DSP (Digital Signal Processor).

To achieve one or more of the above objects and advantages, according to an exemplary embodiment, there is provided a radar system including: a quadrature push—push oscillator for generating four harmonics with a 90-degree phase difference from each other, and producing two-balanced $2^{nd}$ harmonic signals from the harmonics; a first coupler block for radiating one of the $2^{nd}$ harmonics through an antenna; a second coupler block for terminating the other $2^{nd}$ harmonic to ground; a power combiner for combining a transmitted signal that is leaked from the first and second coupler blocks with the received signal that is radiated through the antenna; a 90-degree phase shifter for shifting the phase of the output signal from the power combiner by 90 degrees; a first quadrature mixer for mixing an in-phase harmonic signal inputted from the quadrature push—push oscillator with the output signal from the power combiner, and outputting a first baseband signal; and a second quadrature mixer for mixing a quadrature-phase harmonic signal inputted from the quadrature push—push oscillator with the output signal from the 90-degree phase shifter, and outputting a second baseband signal.

In the exemplary embodiment, the first baseband signal and the second baseband signal are 90 degrees out of phase from each other.

In the exemplary embodiment, the second coupler block uses a termination resistance with a matched impedance of the antenna to terminate the $2^{nd}$ harmonic signals outputted from the quadrature push—push oscillator to ground.

In the exemplary embodiment, the second coupler block uses a variable impedance to terminate the harmonic signals outputted from the quadrature push—push oscillator to ground.

The radar system may further include a DSP (Digital Signal Processor) for monitoring a DC-offset signal outputted from the first and second quadrature mixers, and adjusting the variable impedance according to an external control signal.

The first and the second coupler blocks may include, for example, a power divider or a circulator, and a predetermined 4-port coupler. In this case, the 4-port coupler is either a directional coupler or a Lange coupler.

The power combiner may include, for example, a 3-port combiner. In this case, the 3-port combiner is either a Wilkinson combiner or a T-junction combiner.

The first and/or second quadrature mixers may be composed of a passive mixer for mixing through a passive device.

In the radar system according to an exemplary embodiment of the present invention, two balanced $2^{nd}$ harmonic signals with the same magnitude, but 180-degree phase difference therebetween, are produced from the quadrature push—push oscillator, in which one of them is radiated through the antenna and the other is terminated at the termination resistance or the variable impedance. Here, the transmitted signals leaked from the first and second coupler blocks, two being 180 degrees out of phase from each other, are offset by the power combiner. As such, only the received signal that is radiated through the antenna is outputted, and this output signal then undergoes the phase difference by the 90-degree phase shifter. The phase shifted signal is thereafter mixed with the in-phase harmonic and with the quadruple-phase harmonic outputted from the quadrature push—push oscillator, respectively, and outputted as first and second baseband signals.

BRIEF DESCRIPTION OF THE DRAWINGS

The above aspects and features of the present invention will be more apparent by describing certain exemplary embodiments of the present invention with reference to the accompanying drawings, in which.

DETAILED DESCRIPTION OF THE PREFERRED EMBODIMENTS

Preferred embodiments of the present invention will be described herein below with reference to the accompanying drawings.

Figure 1A:
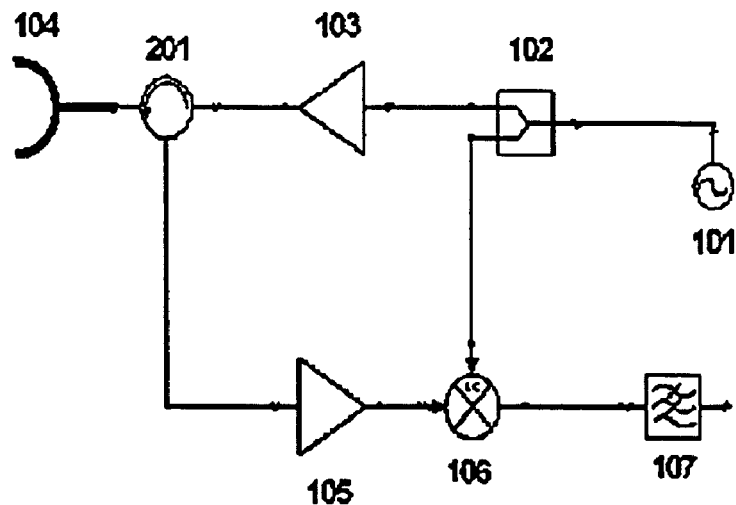
FIGS. 1A and 1B illustrate, respectively, a schematic circuit diagram of a related art radar system.
Figure 1B:
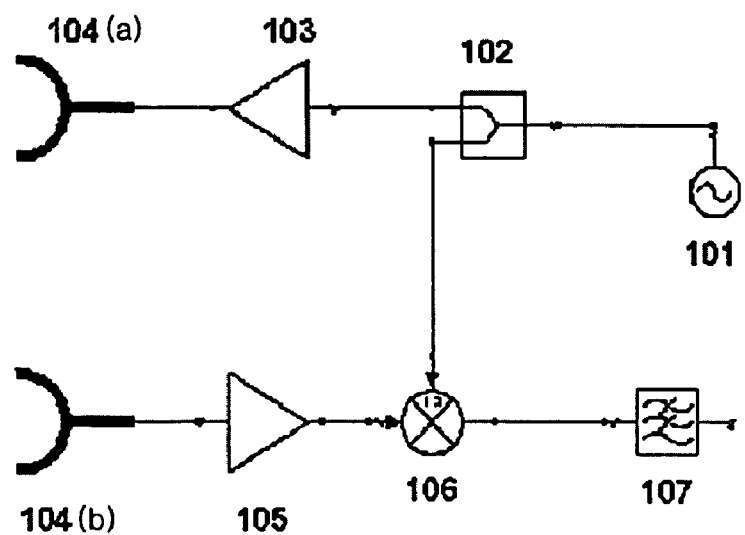
Figure 2:
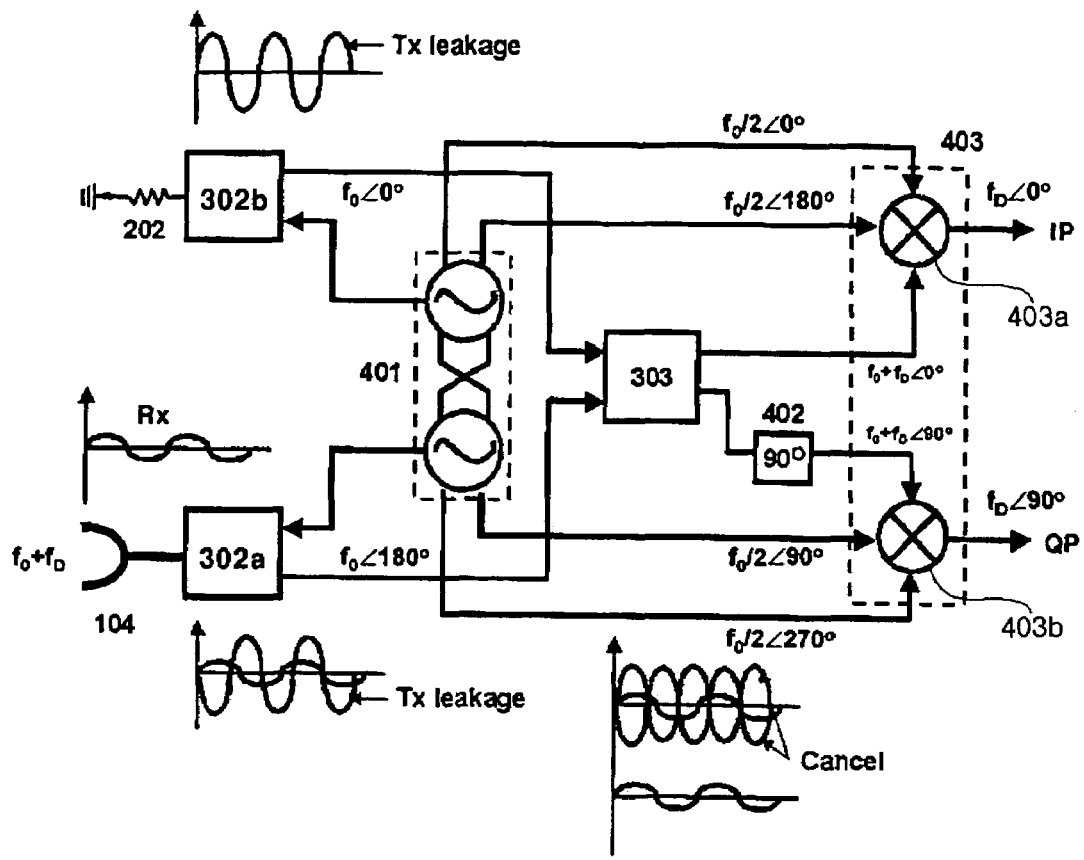
FIG. 2 is a circuit diagram of a radar system according to one exemplary embodiment of the present invention.

FIG. 2 is a circuit diagram of a radar system according to one exemplary embodiment of the present invention. Referring to FIG. 2, the radar system of the present invention includes a quadrature push—push oscillator 401, a first coupler block 302a, a second coupler block 302b, a power combiner 303, a 90-degree phase shifter 402, and a quadrature subharmonic mixer 403. The quadrature subharmonic mixture 403 includes a first quadrature mixer 403a and a second quadrature mixer 403b.

The quadrature push—push oscillator 401 generates four harmonics with a 90-degree phase difference between them, and produces two-balanced $2^{nd}$ harmonic signals therefrom.

The first coupler block 302a radiates through the antenna 104 one of the $2^{nd}$ harmonic signals produced by the quadrature push—push oscillator 401, and the second coupler block 303b terminates the other balanced signal produced from the quadrature push—push oscillator 401 to the ground. In this case, the first and the second coupler block 302a, 302b can include a power divider or a circulator. The first coupler block 302a uses the power divider or the circulator to distinguish a transmitted signal and a received signal.

The power combiner 303 combines a received signal inputted through the antenna 104 and a leakage signal Tx from the first and second coupler blocks 302a, 302b. In short, the power combiner 303 prevents the leakage signal Tx from mixing with the received signal. Therefore, only received signals can be outputted from the power combiner 303.

The 90-degree phase shifter 402 shifts the phase of the output signal from the power combiner 303 by 90 degrees.

The output signal from the power combiner 303 and the output signal from the 90-degree phase shifter 402 are applied to the quadrature subharmonic mixer 403, respectively. The first quadrature mixer 403a mixes an in-phase signal among the harmonic signals generated from the quadrature push—push oscillator 401 with the output signal from the power combiner 303, and outputs a first baseband signal IP. On the other hand, the second quadrature mixer 403b mixes a quadrature-phase signal among the harmonic signals from the quadrature push—push oscillator 401 with the output signal from the 90-degree phase shifter 402, and outputs a second baseband signal QP.

The output signals from the quadrature subharmonic mixer 403, namely the first and second baseband signals IP, QP can be 90 degrees out of phase from each other. These signals are used to find out whether the output signals are phase-lead or phase-lag. Also, based on this the radar system obtains the direction information of a target object, e.g., whether the target object is coming closer or moving farther away.

Figure 3:
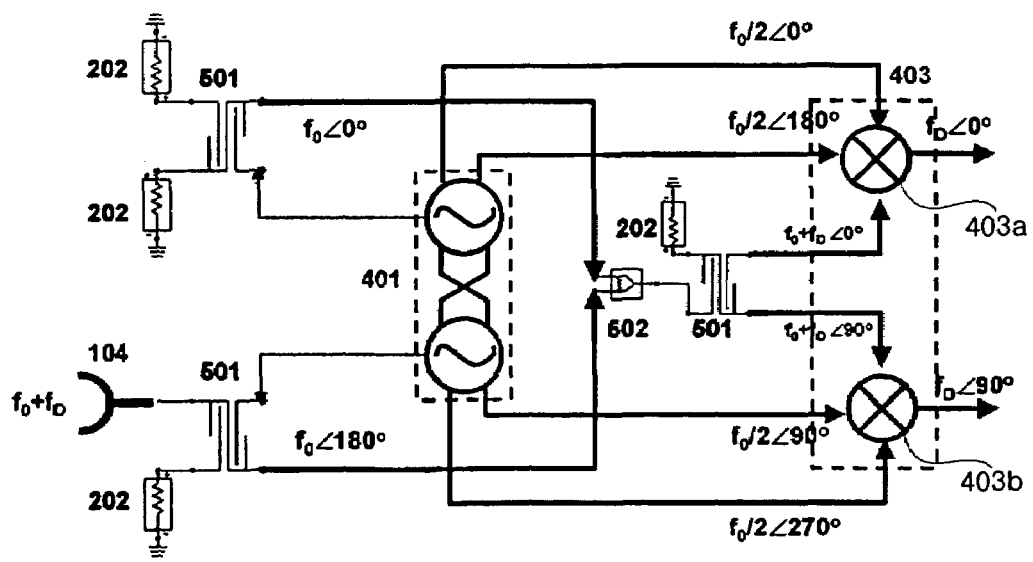
FIG. 3 is a circuit diagram illustrating in detail the radar system of FIG. 2.

FIG. 3 is a circuit diagram illustrating in detail the radar system of FIG. 2. Referring to FIG. 3, the radar system includes the first and the second coupler block 302a, 302b of FIG. as a 4-port coupler, such as a Lange coupler 501. Optionally, a directional coupler (which is also a 4-port coupler) can be used as well. Further, the first and the second coupler block 302a, 302b can include a power divider or a circulator to distinguish the transmitted signal and the received signal.

Also, as shown in FIG. 3, the power combiner 303 of FIG. 2 is a 3-port combiner like a Wilkinson combiner 502. Optionally, a T-Junction combiner (which is also a 3-port coupler) can be used as well.

Meanwhile, the quadrature subharmonic mixer 403 of FIG. 2 can be implemented as a passive mixer, such as a resistive mixer, to prevent a bias current flowing into the mixer and reduce flicker noise.

The second coupler block can further include a variable impedance to terminate the $2^{nd}$ harmonic signals to ground. By adjusting the magnitude of the variable impedance, a DC-offset caused by the leakage signal of the local oscillator and the even-order distortion of an input signal to the receiving end can be removed through the quadrature subharmonic mixer 403.

The following will now explain the operation of the radar system using the quadrature signal.

Figure 4:
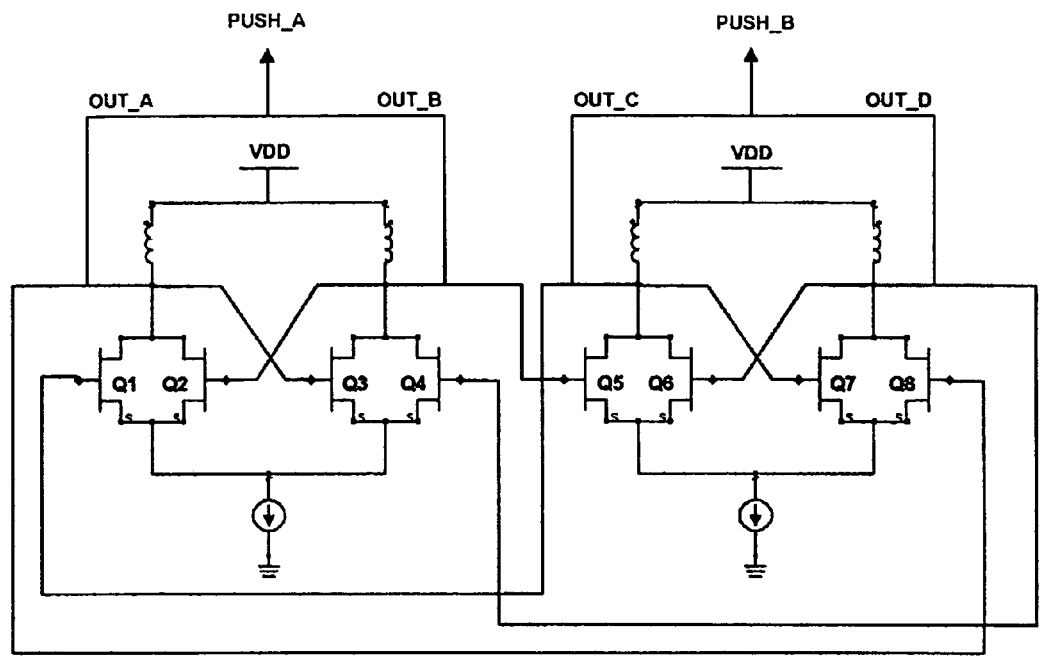
FIG. 4 is a circuit diagram of a quadrature push—push oscillator for use in the radar system of FIG. 2.
Figure 4:
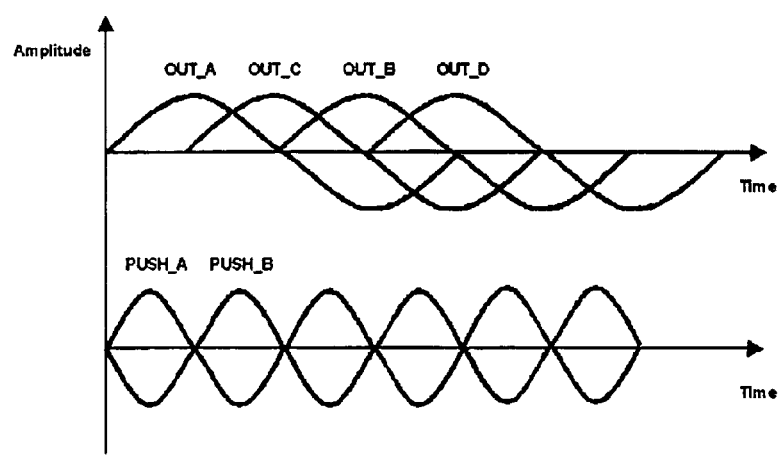

FIG. 4 is a circuit diagram illustrating in detail the quadrature push—push oscillator. Referring to FIG. 4, the quadrature push—push oscillator 401 produces 4 signals OUT_A, OUT_B, OUT_C, OUT_D that are 90 degrees out of phase from each other. If the in-phase signal 0° and the 180-degree signals OUT_A, OUT_B are combined, and the quadrature-phase signal 90° and the 270-degree signals OUT_C, OUT_D are combined, the fundamental signals are offset, and only the $2^{nd}$ harmonic signal components are left. As such, two $2^{nd}$ harmonic signals PUSH_A, PUSH_B, that are twice the frequency of the fundamental are generated. Those two $2^{nd}$ harmonic signals PUSH_A, PUSH_B are 180 degrees out of phase from each other and as a result, two balanced $2^{nd}$ harmonic signals PUSH_A, PUSH_B are outputted.

Thus, outputted signals Tx are inputted to the Lange coupler of the first and the second coupler block 302a, 302b, respectively. Here, the first coupler block 302a is connected to the 50 ohm antenna 104, so the balanced signals are radiated through the antenna 104, and signals that are reflected again from the target object are inputted through this same antenna 104. The second coupler block 302b is a termination resistance 202 in 50-ohm impedance similar to the antenna 104. Therefore, the balanced signals are terminated to ground and not radiated at all.

By the nature of isolation of the Lange couplers in the first and second coupler blocks 302a, 302b, the transmitted signals Tx are damped in a certain degree. But the isolation is so low that the transmitted signals Tx are mixed with the received signal. In this case, the transmitted signals Tx leaked from the first and second coupler blocks 302a, 302b have the same magnitude but are 180 degrees out of phase from each other. Hence, the leakage signals are offset when combined by the power combiner 303 (e.g., the Wilkinson power combiner). At the end, only the received signal Rx that was reflected from the target object is left.

Figure 5:
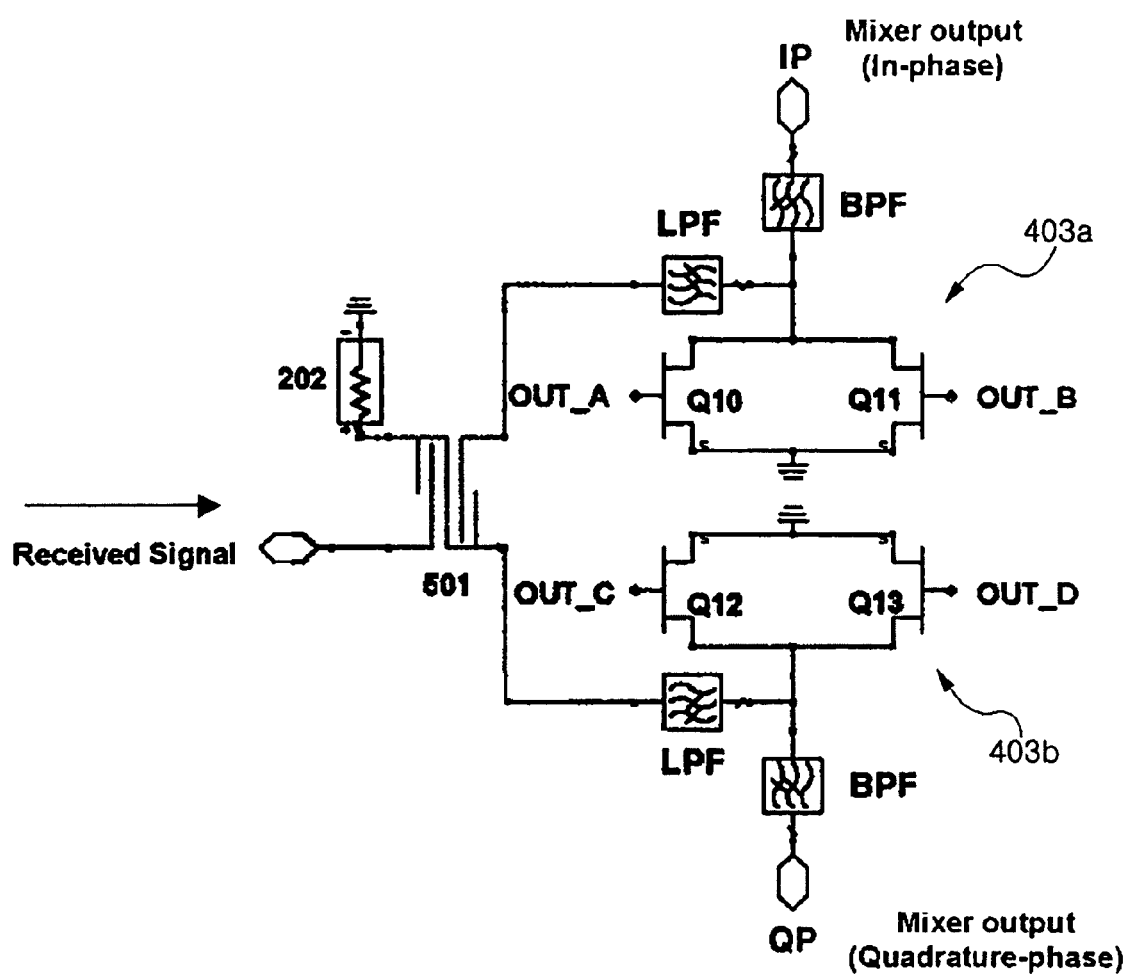
FIG. 5 is a circuit diagram of a mixer unit for use in the radar system of FIG. 2.

FIG. 5 is a circuit diagram illustrating in detail the 90-degree phase shifter 402 and the quadrature subharmonic mixer 403. Referring to FIGS. 2 and 5, the received signal Rx detected by the power combiner 303 undergoes the 90-degree phase shift by the 90-degree phase shifter composed of the Lange coupler 502. Together with the harmonic signals outputted from the quadrature push—push oscillator 401 the signal Rx is divided into the in-phase components OUT_A, OUT_B and quadrature-phase components OUT_C, OUT_D, and inputted to the quadrature subharmonic mixer 403. Then the first quadrature mixer 403a and the second quadrature mixer 403b in the quadrature subharmonic mixer 403 perform the quadrature mixing on the input signals, respectively, and output the first and second baseband signals IP, QP.

Also, the first baseband signal IP (which is the in-phase signal) and the second baseband signal QP (which is the quadrature-phase signal) are compared to determine whether they are phase-lead or phase-lag, and based on this comparison the radar system figures out whether the target object is approaching closer or moving farther away.

Figure 6:
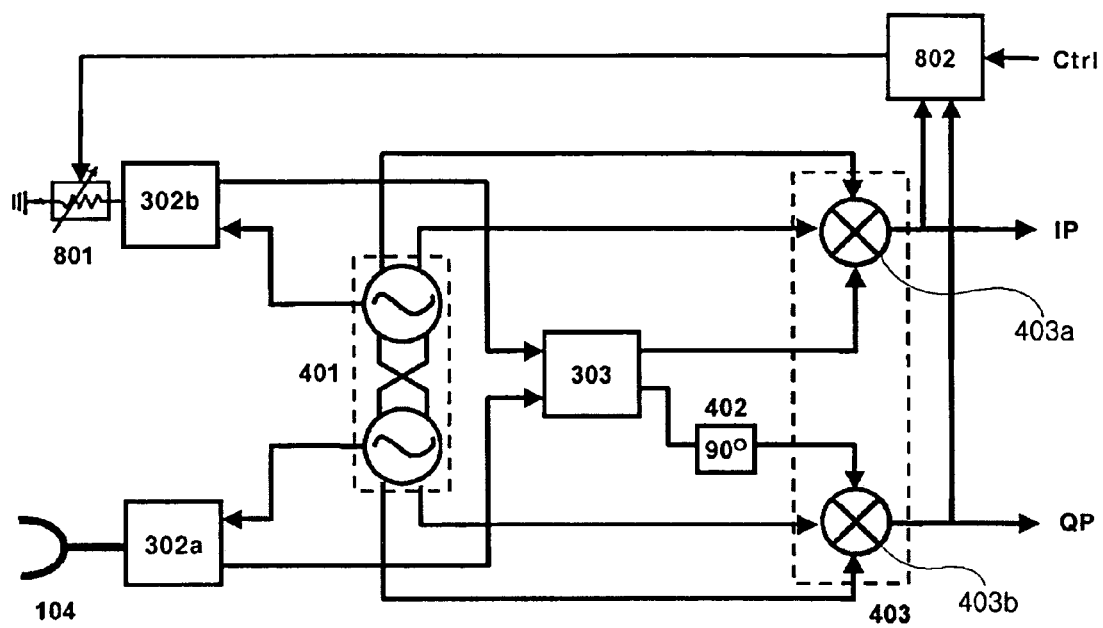
FIG. 6 is a circuit diagram of another exemplary embodiment of a radar system capable of correcting a mismatch using a quadrature signal.

FIG. 6 is a circuit diagram of another exemplary embodiment of the radar system capable of correcting a mismatch using the quadrature signal. Although mismatches could occur very often because different components are connected to the places where the antenna 104 is connected and the termination resistance 202 is terminated, this problem can be resolved by connecting a variable impedance 801 in replacement of the termination resistance 202.

In such case, a DSP (Digital Signal Processor) 802 is further included to adjust the impedance of the variable impedance 801. As such, the DSP 802 monitors the DC-offset of the first and second baseband signals IP, QP outputted from the quadrature subharmonic mixer 403, and varies the impedance of the variable impedance 801 according to an external control signal Ctrl. As a result, the variable impedance is matched to 50 ohm (i.e., the same as the antenna 104), and the mismatched components can be corrected.

As described, by using the quadrature push—push oscillator and the quadrature subharmonic mixer according to the exemplary embodiments, the radar system, despite its low-frequency elements, exhibits high-performance characteristics in a harmonic band like the millimeter band and can be cost effectively manufactured.

Moreover, the leakage signal of the sending end can be easily offset by generating the balanced $2^{nd}$ harmonic signals by means of the quadrature push—push oscillator. Thus, the receiving sensitivity of the radar system can be increased, and it becomes possible to prevent a next circuit from being in a saturation state. Also, by sharing a single antenna for transmitting and receiving, the radar system can be made very small.

Also, by using the quadrature subharmonic mixer it becomes possible to remove the DC-offset caused by the leakage signal of the local oscillator, and prevent system malfunction by suppressing the occurrence of interference, which is caused by the even-order distortion of the signal inputted through the receiving end, in the baseband. Particularly, by utilizing the passive mixer such as the resistive mixture for the quadrature subharmonic mixer it becomes possible to prevent the bias current from flowing into the mixture. As a result, less flicker noise is generated and the receiving sensitivity of the radar system is improved.

Further, the quadrature type mixer also enables the radar system to determine whether the output signals are phase-lead or phase-lag, which in turn gives the directional information on the target object, e.g., whether the target object is coming closer or moving farther away.

The foregoing embodiment and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A radar system comprising:
 a quadrature push—push oscillator for generating four harmonics with a 90-degree phase difference from each other, and for producing two-balanced $2^{nd}$ harmonic signals from the harmonics;
 a first coupler block for radiating one of the $2^{nd}$ harmonics through an antenna;
 a second coupler block for terminating the other $2^{nd}$ harmonic to ground;
 a power combiner for combining a transmitted signal that is leaked from the first and second coupler blocks with the received signal that is radiated through the antenna;
 a 90-degree phase shifter for shifting the phase of the output signal from the power combiner by 90 degrees;
 a first quadrature mixer for mixing an in-phase harmonic signal inputted from the quadrature push—push oscillator with the output signal from the power combiner, and outputting a first baseband signal; and
 a second quadrature mixer for mixing a quadrature-phase harmonic signal inputted from the quadrature push—push oscillator with the output signal from the 90-degree phase shifter, and outputting a second baseband signal.

2. The radar system according to claim 1, further comprising a termination resistance with a matched impedance of the antenna, and wherein the second coupler block uses the termination resistance to terminate the $2^{nd}$ harmonic signals outputted from the quadrature push—push oscillator to ground.

3. The radar system according to claim 1, further comprising a variable impedance, and wherein the second coupler block uses the variable impedance to terminate the harmonic signals outputted from the quadrature push—push oscillator to ground.

4. The radar system according to claim 3, further comprising:
 a DSP (Digital Signal Processor) for monitoring a DC-offset signal outputted from the first and second quadrature mixers, and adjusting the variable impedance according to an external control signal.

5. The radar system according to claim 1, wherein the first baseband signal and the second baseband signal are 90 degrees out of phase from each other.

6. The radar system according to claim 1, wherein the first and the second coupler blocks comprise one of a power divider and a circulator, and a predetermined 4-port coupler.

7. The radar system according to claim 6, wherein the 4-port coupler is one of a directional coupler and a Lange coupler.

8. The radar system according to claim 1, wherein the power combiner comprises a 3-port combiner.

9. The radar system according to claim 8, wherein the 3-port combiner is one of a Wilkinson combiner and a T-junction combiner.

10. The radar system according to claim 1, wherein at least one of the first and second quadrature mixers comprises a passive mixer for mixing through a passive device.

* * * * *